United States Patent
Yoshitake

(10) Patent No.: US 6,555,848 B2
(45) Date of Patent: Apr. 29, 2003

(54) DIODE HAVING BREAKDOWN VOLTAGE ADJUSTABLE TO ARBITRARY VALUE WITHOUT INCREASE OF PARASITIC CAPACITANCE AND PROCESS FOR FABRICATION THEREOF

(75) Inventor: Tomonobu Yoshitake, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/875,517

(22) Filed: Jun. 6, 2001

(65) Prior Publication Data

US 2001/0050374 A1 Dec. 13, 2001

(30) Foreign Application Priority Data

Jun. 7, 2000 (JP) ............................ 2000-170304

(51) Int. Cl.[7] .............................. H01L 29/861
(52) U.S. Cl. ................. 257/104; 257/107; 257/119
(58) Field of Search ............... 257/104, 107, 257/119, 142, 360; 438/133, 140

(56) References Cited

U.S. PATENT DOCUMENTS 5,502,317 A * 3/1996 Duvvury .................... 257/107
5,548,152 A * 8/1996 Arai ......................... 257/360
5,977,569 A * 11/1999 Li ............................ 257/119
6,355,508 B1 * 3/2002 Porter et al. ............... 438/140
6,404,018 B1 * 6/2002 Wu et al. ................... 257/368

FOREIGN PATENT DOCUMENTS

JP        8-153887        6/1996        ........... H01L/31/10

* cited by examiner

Primary Examiner—David Nelms
Assistant Examiner—Dao H. Nguyen
(74) Attorney, Agent, or Firm—Michael Best & Friedrich, LLC

(57) ABSTRACT

A lightly doped n-type semiconductor layer is epitaxially grown on a heavily doped n-type semiconductor substrate, and a heavily doped n-type impurity region, a lightly doped p-type deep guard ring and a heavily doped p-type shallow impurity region are formed in said lightly doped semiconductor layer in such a manner that a diode has a major p-n junction between the heavily doped n-type impurity region and the heavily doped p-type shallow impurity region and other p-n junction between the lightly doped n-type semiconductor layer and the lightly doped p-type guard ring, wherein the other p-n junction is wider in area than the major p-n junction so that the breakdown voltage is adjustable without increase of parasitic capacitance dominated by the other p-n junction.

14 Claims, 7 Drawing Sheets

DIODE HAVING BREAKDOWN VOLTAGE ADJUSTABLE TO ARBITRARY VALUE WITHOUT INCREASE OF PARASITIC CAPACITANCE AND PROCESS FOR FABRICATION THEREOF

FIELD OF THE INVENTION

This invention relates to a semiconductor device and, more particularly, to a diode incorporated in a semiconductor device and a process for fabricating a protective diode.

DESCRIPTION OF THE RELATED ARTS

Diodes have found a wide variety of applications in electric circuits. The diode permits electric current to flow therethrough only unidirectionally. When being focused on the diode characteristics that it "flows forward electric current", the diode is used as an essential part of a rectifier. On the other hand, when being focused on the diode characteristics that it "blocks reverse electric current", the diode serves as a protective element against abnormal voltage applied to a circuit component.

The later application is hereinbelow described. A semiconductor device has plural conductive terminals between an internal integrated circuit and an external electric circuit, and electric signals are transferred between the external circuit and the internal integrated circuit through the conductive terminals. Thus, the conductive terminals are indispensable components of a semiconductor device. However, the conductive terminals are exposed to the environment, and extremely high serge voltage is liable to be applied to the conductive terminals. If the extremely high serge voltage is directly applied to circuit components of the internal integrated circuit, the circuit components are seriously damaged, and the semiconductor device is to be replaced with a new one.

In order to protect the circuit components of the internal integrated circuit device against the extremely high serge voltage, protective diodes are formed in the semiconductor device, and are connected to conductive paths between the conductive terminals and the circuit components of the internal integrated circuit.

FIG. 1 shows a typical example of the protective diode. The prior art protective diode 1 is usually connected to a signal path between a conductive terminal and an input transistor of an integrated circuit. The protective diode 1 includes a heavily doped n-type well 2, a p-type impurity region 3 and a p-type guard ring 4. The heavily doped n-type well 2 is formed in an n-type semiconductor substrate, and the p-type impurity region 3 and the heavily doped n-type well 2 forms a p-n junction serving as a Zener diode. The p-type impurity region 3 is encircled by the p-type guard ring 4, which is deeper than the p-type impurity region 3. Thus, the p-type impurity region 3 and the p-type guard ring 4 form in combination a graft base structure.

The p-type guard ring expands the p-n junction, and the wide p-n junction allows the prior art protective diode 1 to flow a large amount of electric current due to the extremely high surge voltage or electrostatic discharge into the n-type semiconductor substrate. In other words, the wide p-n junction is desirable from the viewpoint of the anti-electrostatic discharge characteristics of the protective diode. However, the wide p-n junction has a large amount of parasitic capacitance. While the integrated circuit is operating, an input signal is supplied from the associated conductive terminal to the input transistor. A large amount of parasitic capacitance is causative of deformation of the waveform of the input signal, and the wide p-n junction is not desirable from the viewpoint of signal propagation characteristics. Thus, there is a trade-off between the anti-electrostatic discharge characteristics and the signal propagation characteristics.

The p-n junction between the p-type impurity region 3 and the heavily doped n-type well 2 has a strong influence on both of the parasitic capacitance and the breakdown voltage, and the designer suffers from the parasitic capacitance strongly tied up to the breakdown voltage in the prior art diode. In detail, the prior art diode is expected to be broken down at a certain voltage before the input transistor is damaged. However, the prior art protective diode is to be maintained in off-state while the electric signal is propagated between the conductive terminal and the input transistor. The breakdown phenomenon takes place at a critically strong electric field created across the depletion layer developed from the p-n junction between the p-type impurity region 3 and the heavily doped n-type well 2. The heavier the dopant concentration, thinner the depiction layer. The electric field easily exceeds the critical value in a thin depletion layer. For this reason, the breakdown voltage is mainly dependent on the impurity concentration of the heavily doped n-type well 2. The parasitic capacitance is dependent on the thickness of the depletion layer as well as the area of the p-n junction. The thin depletion layer undesirably increases the parasitic capacitance. When a designer gives a high breakdown voltage to the prior art diode 1, the parasitic capacitance is unavoidably increased, and the electric signal tends to be deformed due to the large parasitic capacitance. Thus, the breakdown voltage is strongly tied up to the parasitic capacitance, and the designer feels it difficult to design an optimum diode. The obstacle for the designer is the parasitic capacitor strongly tied up to the breakdown voltage.

Although another prior art diode is disclosed in Japanese Patent Publication of Unexamined Application (laid-open) No. 8-153887, the prior art diode is a photo diode. The technical target of the prior art photo diode is to improve the signal-to-noise ration as well as widen the dynamic range, and a heavily doped p-type impurity region is formed in the heavily doped n-type well by using an ion-implantation or a thermal diffusion technique.

SUMMARY OF THE INVENTION

It is therefore an important object of the present invention to provide a diode, which is adjustable to an appropriate breakdown voltage without taking parasitic capacitance into account.

It is also an important object of the present invention to provide a process for fabricating the protective diode.

To accomplish the object, the present invention proposes to form plural junctions one of which has an influence on the breakdown voltage of a diode and the other of which dominates the parasitic capacitor.

In accordance with one aspect of the present invention, there is provided a diode comprising a first semiconductor layer having a first conductivity type, and a second semiconductor layer having a second conductivity type opposite to the first conductivity type and including plural regions different in dopant concentration so as to form plural junctions different in electric characteristics from one another.

In accordance with another aspect of the present invention, there is provided a process for fabricating a diode, comprising the steps of a) preparing a heavily doped semiconductor layer having one conductivity type, b) growing a lightly doped semiconductor layer of the aforesaid one conductivity type on the heavily doped semiconductor layer, c) forming a guard ring having the other conductivity type opposite to the aforesaid one conductivity type in the lightly doped semiconductor layer so as to form a first junction together with the lightly doped semiconductor layer, d) forming an impurity region of the aforesaid one conductivity type in a surface portion of the lightly doped semiconductor layer inside of the guard ring, and e) forming another impurity region of the other conductivity type in a surface portion of the impurity region and a surface portion of the guard ring so as to form a second junction different in electric characteristics from the first junction together with the impurity region.

In accordance with another aspect of the present invention, there is provided a process for fabricating a diode, comprising the steps of a) preparing a heavily doped semiconductor layer having one conductivity type, b) growing a lightly doped semiconductor layer of the aforesaid one conductivity type on the heavily doped semiconductor layer, c) forming an impurity region of the aforesaid one conductivity type in the lightly doped semiconductor layer and d) forming another impurity region having the other conductivity type opposite to the aforesaid one conductivity type in a surface portion of the impurity region and a surface region of the lightly doped semiconductor layer so as to form a first junction together with the lightly doped semiconductor layer and a second junction different in electric characteristics from the first junction together with the impurity region.

BRIEF DESCRIPTION OF THE DRAWINGS

The features and advantages of the protective diode and the process will be more clearly understood from the following description taken in conjunction with the accompanying drawings in which.

DESCRIPTION OF THE PREFERRED EMBODIMENTS

First Embodiment

Figure 2:
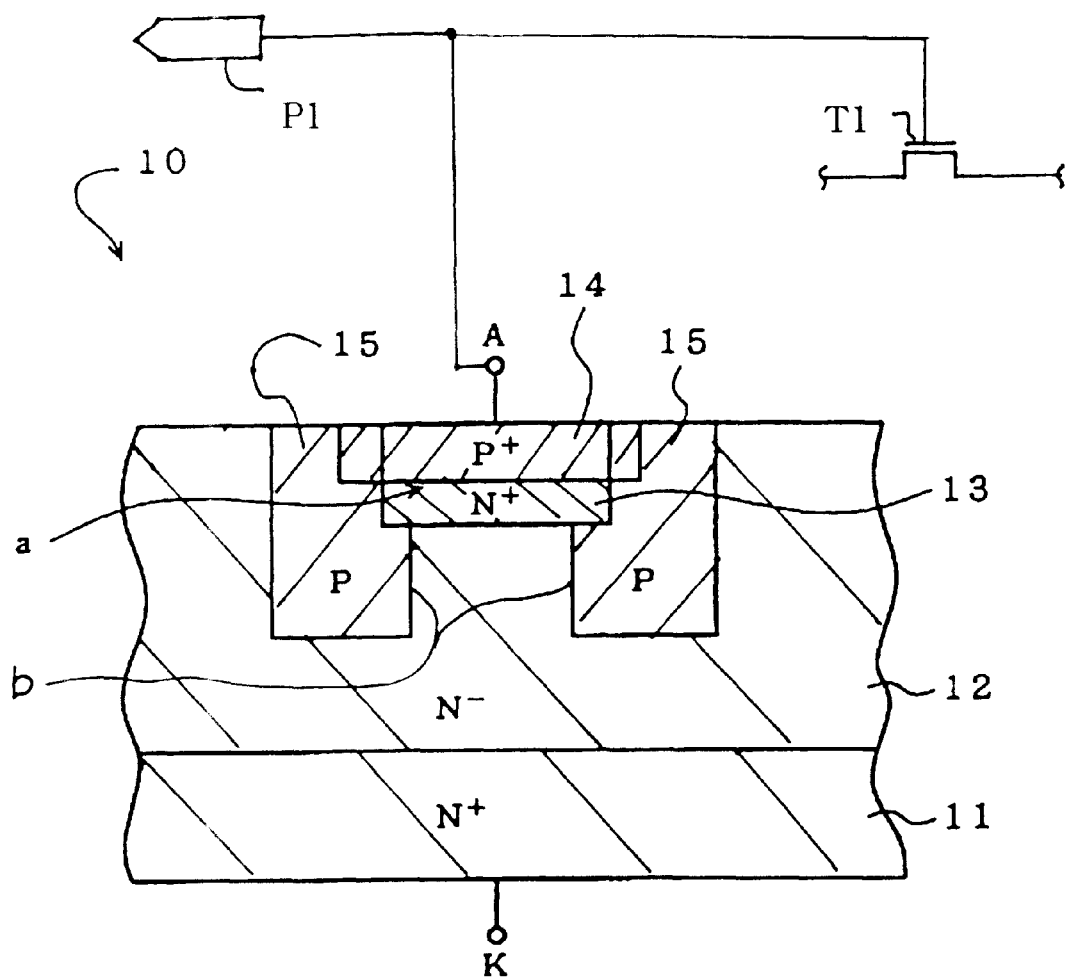
FIG. 2 is a cross sectional view showing the structure of a protective diode according to the present invention.

Referring to FIG. 2 of the drawings, a protective diode 10 is integrated on a heavily doped n-type semiconductor substrate 11 together with an input field effect transistor T1 forming a part of an internal electric circuit. A pin P1 is connected to the gate electrode of the input field effect transistor T1, and the protective diode 10 is connected to the signal path between the pin P1 and the gate electrode of the input field effect transistor T1. The heavily doped n-type semiconductor substrate 11 is doped at $1 \times 10^{18}$ cm$^{-3}$ or greater than it, and has resistivity equal to or less than 20/1000 ohm-cm.

The protective diode 10 comprises a lightly doped n-type semiconductor layer 12, a heavily doped n-type impurity region 13, a heavily doped p-type impurity region 14 and a p-type guard ring 15. The lightly doped n-type semiconductor layer 12 is epitaxially grown on the heavily doped n-type semiconductor substrate 11, and the heavily doped n-type impurity region 13 is formed in a surface portion of the lightly doped n-type semiconductor layer 12. The heavily doped p-type impurity region 14 is partially overlapped with the heavily doped n-type impurity region 13, and is shallower than the heavily doped n-type impurity region 13. Thus, the heavily doped p-type impurity region 14 and the heavily doped n-type impurity region 13 form a major p-n junction a. The p-type guard ring 15 is formed around the heavily doped p-type impurity region 14 as well as around the heavily doped n-type impurity region 13. The p-type guard ring 15 is deeper than the heavily doped n-type impurity region 13 so that the major p-n junction a is provided inside of the p-type guard ring 15. The p-type guard ring 15 projects into the lightly doped n-type semiconductor layer 12, and forms a p-n junction b at the boundary to the lightly doped n-type semiconductor layer 12. The p-n junction b is much wider than the major p-n junction a. The lightly doped n-type semiconductor layer 12 may be smaller in dopant concentration than the heavily doped n-type well 2 by one order of magnitude.

The Zener breakdown voltage is dependent on the major p-n junction a. The other p-n junction b does not have any influence on the Zener breakdown voltage. On the other hand, the parasitic capacitance is dominated by the other p-n junction b. The influence of the major p-n junction a on the parasitic capacitance is limited as will be described hereinlater. The property of the p-n junction a is mainly dependent on the dopant concentration of the heavily doped n-type impurity region 13, on the other hand, the property of the other p-n junction is dominated by the dopant concentration of the lightly doped n-type semiconductor layer 12 as well as the dopant concentration of the p-type guard ring 15. Thus, the breakdown voltage is not strongly tied up to the parasitic capacitance. In this instance, even though the breakdown voltage is adjusted to the optimum value, the parasitic capacitance coupled to the protective diode 10 remains small. In fact, the parasitic capacitance coupled to the protective diode 10 is smaller than that of the prior art protective diode 1, because the p-type guard ring 15 forms the p-n junction b together with the lightly doped n-type semiconductor layer 12.

Subsequently, description is made on how the protective diode is designed. The diode 10 is expected to protect the input field effect transistor T1 against extremely high serge voltage or electrostatic discharge. A certain voltage is applied to the diode 10 during the operation of the semiconductor device substantially at all times. For this reason, the protective diode 10 is designed to have a p-n junction directly affecting the breakdown voltage not on the surface but inside thereof. This means that the protective diode 10 has the graft base structure.

The present inventor investigated the ratio between the parasitic capacitance coupled to the main p-n junction a and the parasitic capacitance coupled to the other p-n junction b at the boundary of the guard ring. The present inventor analyzed a lot of diodes with the graft base structure, and concluded that most of the parasitic capacitance coupled to each diode was due to the p-n junction at the boundary of the guard ring.

As described hereinbefore, the parasitic capacitance is dominated by both of the area and the thickness of a depletion layer developed from a p-n junction. There is a limit to reduction of area. Therefore, the reduction of parasitic capacitance is to be achieved by increasing the thickness of depletion layer. This means that the dopant concentration is to be changed. However, the main p-n junction a is designed to exhibit the target breakdown voltage, and, accordingly, the dopant concentration can not be changed. For this reason, it is effective against the parasitic capacitance to design the p-n junction at the boundary of the guard ring in such a manner as to permit the depletion layer to be developed as wide as possible.

The guard ring 15 is expected to offer a wide current path to the surge current. In this circumstances, it is difficult to reduce the dopant concentration of the p-type guard ring 15. The p-type guard ring 15 forms the p-n junction together with the n-type semiconductor layer. Any serious limit is not set on the n-type semiconductor layer. For this reason, the lightly doped n-type semiconductor layer 12 is employed in the protective diode 10 embodying the present invention.

The present inventor investigated the dopant concentration of the lightly doped n-type semiconductor layer 12 effective against the parasitic capacitance. The lightly doped n-type semiconductor layer 12 was analyzed by using the one-step junction approximation on the assumption of the thickness equal to or greater than 1 micron. The present inventor concluded that the parasitic capacitance was reduced on condition that the resistivity equal to or greater than 0.1 ohm-cm. For example, when the lightly doped n-type semiconductor layer 12 was designed to be 8 microns to 12 microns thick and 45 ohm-cm to 55 ohm-cm, the parasitic capacitance was reduced to a hundredth or less.

The Zener breakdown voltage was designed as follows. The Zener breakdown voltage was targeted of the order of 6 volts. Boron was to be diffused into an n-type region with the resistivity of the order of 10/1000 ohm-cm. The n-type region was coated with a boron source, and the boron was thermally diffused at 1100 degrees in centigrade for 60 minutes. N type dopant impurity has heavily doped, and the dopant concentration was targeted $1 \times 10^{19}$ $cm^{-3}$ at 2.5 micron deep. In order to adjust the breakdown voltage at the target value, the impurity profile of born was to be flat until 3 microns deep. The flat impurity profile was achieved by prolonging the heat treatment for driving the boron thereinto. In this instance, the teat treatment was continued for 3.5 hours.

The present inventor investigated the diode characteristics of samples designed as described hereinbefore. The parasitic capacitance of 26 pF to 37 pF was coupled to the samples of the prior art diode. On the other hand, the parasitic capacitance coupled to the diode according to the present invention was only 5 pF. The diode withstood the electrostatic discharge at about 10 kilovolts, and the Zener breakdown voltage was 6.1 volts.

Subsequently, description is made on a process for fabricating the diode according to the present invention with reference to FIGS. 3A to 3J. The Zener breakdown voltage is targeted at 6 volts. The process starts with preparation of the heavily doped n-type semiconductor substrate 11. The heavily doped n-type semiconductor substrate 11 is formed of silicon.

Figure 3A:
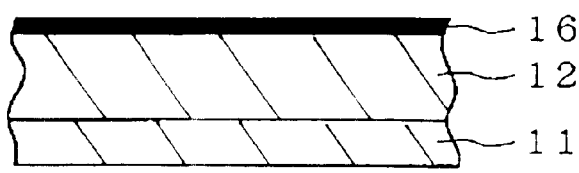
FIGS. 3A to 3J are cross sectional views showing a process for fabricating the protective diode according to the present invention.

Silicon is epitaxially grown to 800 nanometers thick on the heavily doped n-type semiconductor substrate 11, and forms the lightly doped n-type semiconductor layer 12. The lightly doped n-type semiconductor layer 12 is thermally oxidized at about 1000 degrees in centigrade for 180 minutes so as to grow a silicon oxide layer 16 to about 800 nanometers thick in a surface portion of the lightly doped n-type semiconductor layer 12 as shown in FIG. 3A.

Photo-resist solution is spun onto the silicon oxide layer 16, and is baked for forming a photo-resist layer. A pattern image for the p-type guard ring 15 is transferred from a photo mask (not shown), and forms a latent image in the photo-resist layer. The latent image is developed so as to form a photo-resist mask (not shown). Thus, the photo-resist mask is provided on the silicon oxide layer 16 by using photo-lithographic techniques.

Figure 3B:
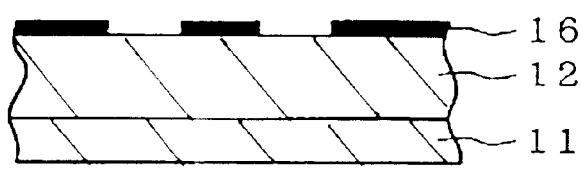
Figure 3C:
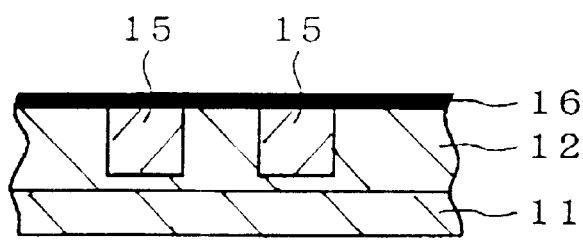
Figure 3D:
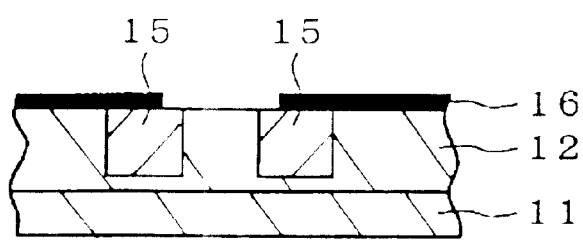

Using the photo-resist mask, the silicon oxide layer 16 is partially etched away so as to expose an upper surface of the lightly doped n-type semiconductor layer 12 as shown in FIG. 3B. The photo-resist mask is stripped off. The exposed surface is coated with a boron-containing diffusion source (not shown), and the boron is thermally diffused from the diffusion source into the lightly doped n-type semiconductor layer 12 at 1100 degrees in centigrade for 60 minutes. Thereafter, the boron is driven into the lightly doped n-type semiconductor layer 12 at about 1000 degrees in centigrade for 30 minutes. The p-type guard ring 15 is formed in the lightly doped n-type semiconductor layer 12, and the exposed surface of the lightly doped n-type semiconductor layer 12 is thermally oxidized. As a result, the diffusion window is closed with the silicon oxide as shown in FIG. 3C.

Figure 3E:
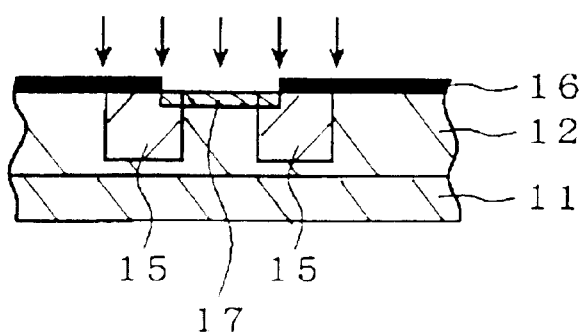
Figure 3F:
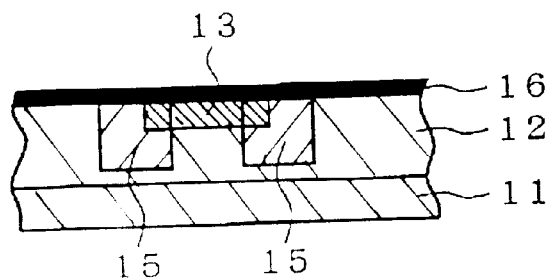

Subsequently, another photo-resist mask (not shown) is formed on the silicon oxide layer 16 by using the photo-lithographic techniques, and the silicon oxide layer 16 is partially etched away for forming a window for an ion-implantation. Phosphorous is ion implanted into the lightly doped n-type semiconductor layer 12 at dosage of $7.0 \times 10^{15}$ $cm^{-2}$. Ion-implanted phosphorous layer 17 is formed in the lightly doped n-type semiconductor layer 12 as shown in FIG. 3E. After the ion-implantation, the phosphorous is driven into the lightly doped n-type semiconductor layer 12 at about 1100 degrees in centigrade for 180 minutes. The phosphorous forms the heavily doped n-type impurity region 13, and the window for the ion-implantation is closed as shown in FIG. 3F.

Figure 3G:
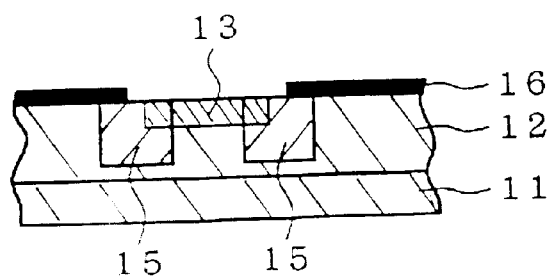
Figure 3H:
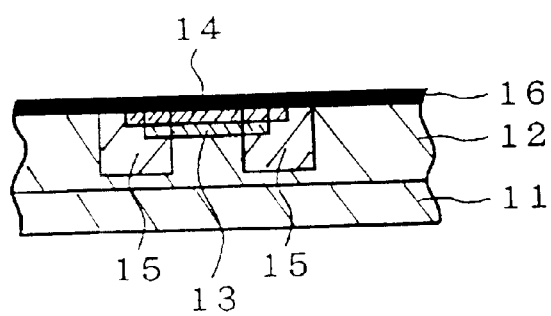

Yet another photo-resist mask (not shown) is formed on the silicon oxide layer 16 by using the photo-lithographic techniques, and the silicon oxide layer 16 is partially etched away for forming a window for a thermal diffusion as shown in FIG. 3G. The heavily doped n-type impurity region 13 and a part of the p-type guard ring 15 are exposed to the window. The photo-resist mask is stripped off. The exposed surface is coated with a boron-containing diffusion source (not shown), and the boron s thermally diffused at about 1100 degrees in centigrade for 60 minutes. The boron is further driven at about 1000 degrees in centigrade for 30 minutes. The boron forms the heavily doped p-type impurity region 14, and the window is closed, again, as shown in FIG. 3H.

Figure 3I:
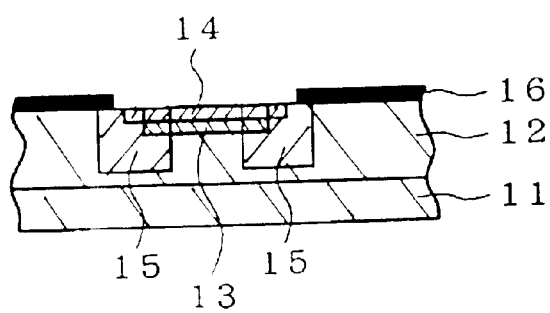

Still another photo-resist mask (not shown) is formed on the silicon oxide layer 16 by using the photo-lithographic techniques. Using the photo-resist mask, the silicon oxide layer 16 is partially etched away for forming a contact hole. The photo-resist mask is stripped off. The heavily doped p-type impurity region 14 and a part of he p-type guard ring 15 are exposed to the contact hole as shown in FIG. 3I.

Figure 3J:
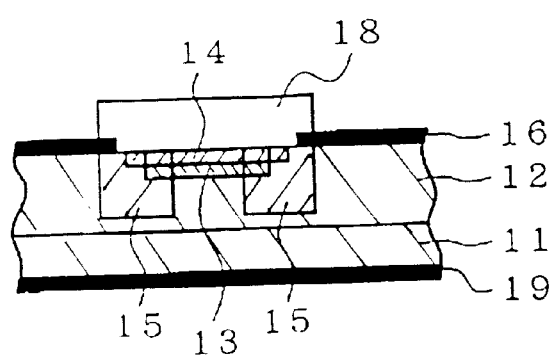

Aluminum is evaporated onto the resultant structure, and forms an aluminum layer. A photo-resist mask is formed on the aluminum layer by using the photo-lithographic techniques, and the aluminum layer is patterned into an electrode 18. Finally, another electrode 19 of gold or silver is formed on the reverse surface of the heavily doped n-type semiconductor layer 11 as shown in FIG. 3J. Thus, the protective diode 10 shown in FIG. 2 is fabricated on the heavily doped n-type semiconductor substrate 11.

As will be understood from the foregoing description, the protective diode according to the present invention has the major p-n junction a and the other p-n junction b. The Zener breakdown voltage is dominated by the major p-n junction, and most of the parasitic capacitance is coupled to the other p-n junction b. The two p-n junctions a and b are independently designed so that the protective diode 10 is adjusted to the target breakdown voltage without serious large amount of parasitic capacitance.

Second Embodiment

Figure 4:
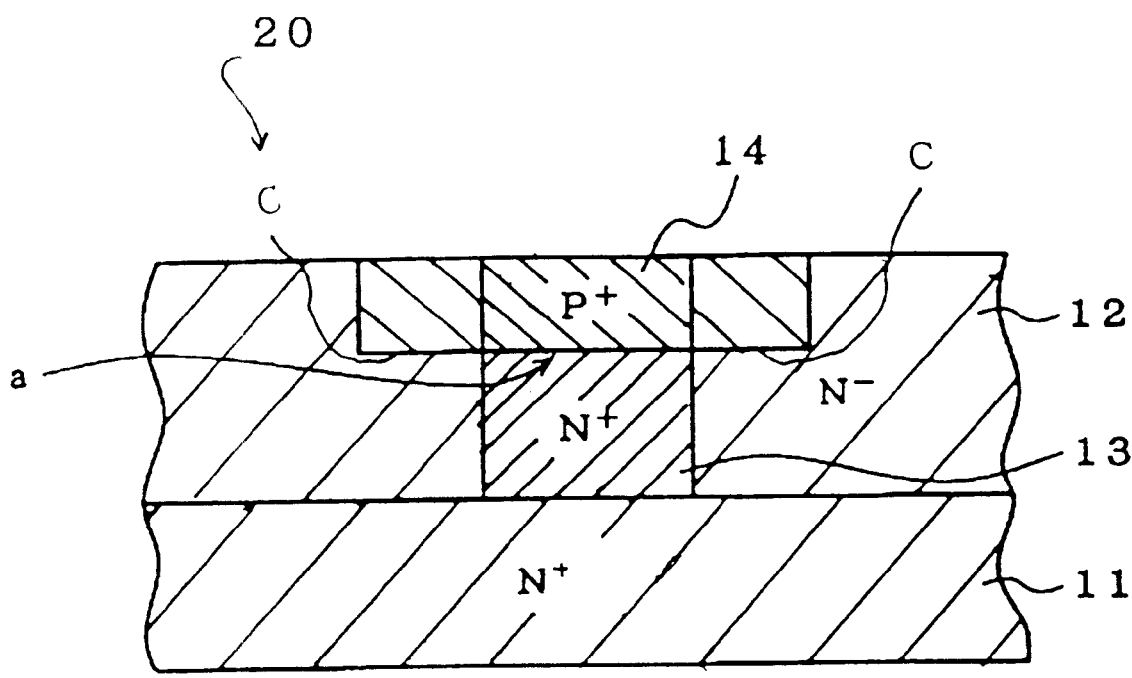
FIG. 4 is a cross sectional view showing the structure of another diode according to the present invention.

Turning to FIG. 4 of the drawings, another diode 20 embodying the present invention is fabricated on a heavily doped n-type semiconductor substrate 11. The diode 20 comprises a lightly doped n-type semiconductor layer 12, a heavily doped n-type impurity region 13 and a heavily doped p-type impurity region 14. The lightly doped n-type semiconductor layer 12 is epitaxially grown on the heavily doped n-type semiconductor substrate 11, and has the dopant concentration of the order of $1 \times 10^{14}$ cm$^{-3}$. The heavily doped n-type impurity region 13 is so deep that the heavily doped n-type impurity region 13 projects into the heavily doped n-type semiconductor substrate 11. This feature is desirable, because the resistance against electric current flowing between the heavily doped n-type impurity region 13 and the heavily doped n-type semiconductor substrate 11 is surely reduced. The heavily doped n-type impurity region 13 is formed by using an ion-implantation, and has the dopant concentration of the order of $1 \times 10^{19}$ cm$^{-3}$. The heavily doped p-type impurity region 14 is shallower than the heavily doped n-type impurity region 13, and is wider than the heavily doped n-type impurity region 13. For this reason, the heavily doped p-type impurity region 14 and the heavily doped n-type impurity region 13 form a major p-n junction a, and the heavily doped p-type impurity region 14 and the lightly doped n-type semiconductor layer 12 form another p-n junction c. Thus, the diode 20 is similar to the protective diode 10 except the p-type guard ring 15.

The Zener breakdown voltage is dominated by the major p-n junction a, and the p-n junction a is designed to have the Zener breakdown voltage at 6 volts. The other p-n junction c achieves a high withstanding voltage against the electrostatic discharge. The withstanding voltage is to be higher than the Zener breakdown voltage, i.e., higher than 6 volts. The withstanding voltage may be of the order of 10 volts. Thus, the combination of the lightly doped n-type semiconductor layer 12 and the heavily doped p-type impurity region 14 serves as the combination of the heavily doped n-type semiconductor layer 12 and the p-type guard ring 15. In case where the lightly doped n-type semiconductor layer 12 has the resistivity of 50 ohm-cm, the withstanding voltage is equal to or greater than 300 volts.

The p-n junction c wider in area than the major p-n junction a so as to be conducive to reduction of the parasitic capacitance coupled to the diode 20. The lightly doped n-type semiconductor layer 12 reduces the parasitic capacitance coupled to the p-n junction equal to or less than 1 pF. The parasitic capacitance coupled to the prior art diode is of the order of 30 pF. Thus, the parasitic capacitance is drastically reduced.

The dopant concentration of the lightly doped n-type semiconductor layer 12 is determined regardless of the Zener breakdown voltage, and the parasitic capacitance is not strongly tied up. Thus, a designer can design the breakdown voltage without increase of the parasitic capacitance.

Figure 5A:
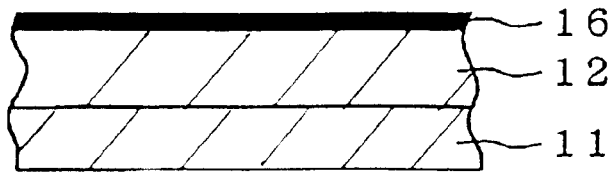
FIGS. 5A to 5I are cross sectional views showing a process for fabricating the diode.

FIGS. 5A to 5I shows a process for fabricating the diode 20. The process starts with preparation of the heavily doped n-type semiconductor substrate 11 of silicon. Silicon is epitaxially grown on the heavily doped n-type semiconductor substrate 11, and forms the lightly doped n-type semiconductor layer 12. A surface portion of the lightly doped n-type semiconductor layer 12 is thermally oxidized at 1000 degrees in centigrade for 180 minutes. Then, the lightly doped n-type semiconductor layer 12 is covered with a silicon oxide layer 16 of the order of 800 nanometers thick as shown in FIG. 5A.

Figure 5B:
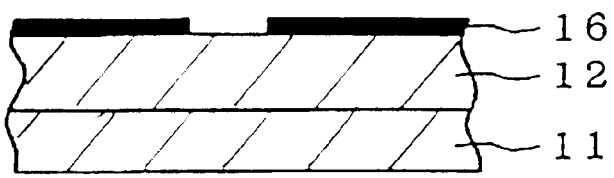

Subsequently, a photo-resist mask (not shown) is prepared on the silicon oxide layer 16 by using the photo-lithographic techniques, and the silicon oxide layer 16 is partially etched away for forming a window for an ion-implantation as shown in FIG. 5B.

Figure 5C:
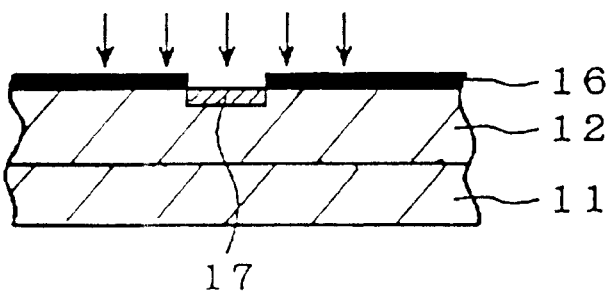

Phosphorous is ion implanted into the lightly doped n-type semiconductor layer 12 through the window at dosage of $7.0 \times 10^{15}$ cm$^{-2}$. Thus, the phosphorous 17 is introduced into the lightly doped n-type semiconductor layer 12 as shown in FIG. 5C.

Figure 5D:
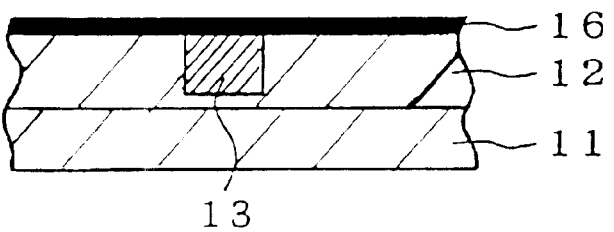

The phosphorous 17 is driven into the lightly doped n-type semiconductor layer 12 through a heat treatment at about 1100 degrees in centigrade for 180 minutes. When the heat treatment is finished, the heavily doped n-type impurity region 13 is formed in the lightly doped n-type semiconductor layer 12, and the window is closed with the silicon oxide grown in the heat treatment as shown in FIG. 5D.

Figure 5E:
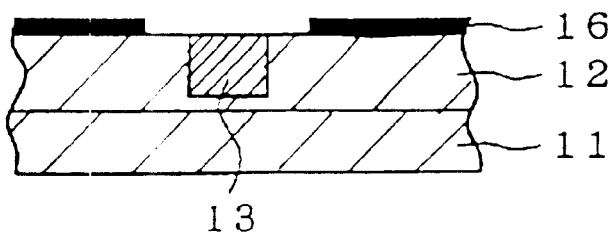

Another photo-resist mask (not shown) is patterned on the silicon oxide layer 16, and the silicon oxide layer 16 is partially etched away for forming another window as shown in FIG. 5E.

Figure 5F:
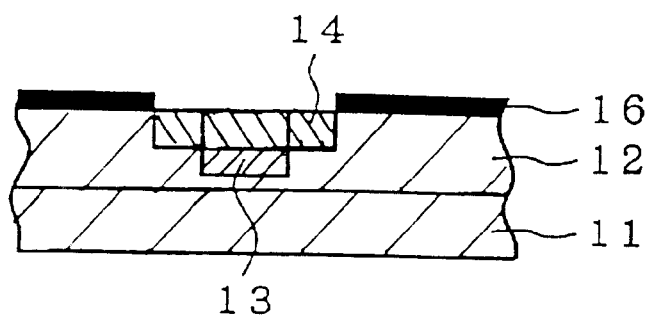
Figure 5G:
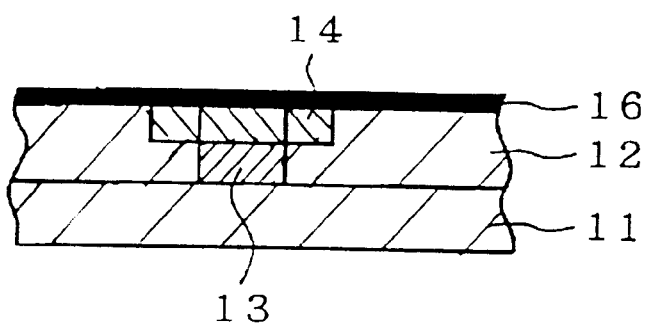
Figure 5H:
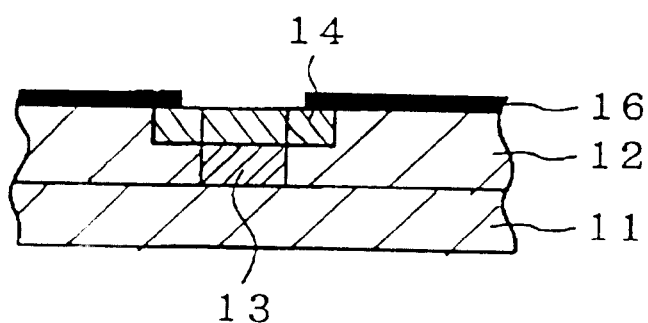

A boron-containing diffusion source (not shown) is spread over the exposed area, and the boron is thermally diffused at about 1100 degrees in centigrade for 60 minutes as shown in FIG. 5F. The boron-containing diffusion source is removed, and the boron is driven into the lightly doped n-type semiconductor layer 12 at about 1000 degrees in centigrade for 30 minutes. While the boron is being driven, the phosphorous is also diffused. The phosphorus reaches the heavily doped n-type semiconductor substrate 11, and the heavily doped n-type impurity region 13 is continued to the heavily doped n-type semiconductor substrate 11 as shown in FIG. 5G. The window is also closed during the heat treatment.

Yet another photo-resist mask (not shown) is patterned on the silicon oxide layer 16 by using the photo-lithographic techniques. The silicon oxide layer 16 is partially etched away so that the heavily doped p-type impurity region 14 is exposed to a window formed in the silicon oxide layer 16 a shown in FIG. 5H.

Subsequently, aluminum is evaporated, and forms an aluminum layer. Still another photo-resist mask (not shown) is patterned on the aluminum layer by using the photo-lithographic techniques. Using the photo-resist mask, the aluminum layer is partially etched away so as to form an electrode 18 on the silicon oxide layer 16.

Figure 5I:
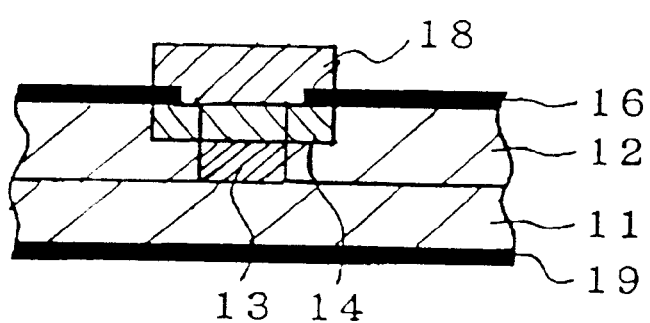

Finally, gold or silver is evaporated on the reverse surface of the heavily doped n-type semiconductor substrate 11, and forms another electrode 19 as shown in FIG. 5I.

The heat treatment is repeated in the process, and the n-type dopant impurity is thermally diffused in the heat treatments. Accordingly, the lightly doped n-type semiconductor layer 12 is reduced in thickness. The minimum thickness of the lightly doped n-type semiconductor layer is the sum of the depth of the heavily doped p-type impurity region 14, the width of the depletion layer developed from the p-n junction c on the normal operating conditions and the decrement of thickness due to the thermal diffusion of n-type dopant impurity from the heavily doped n-type semiconductor substrate 11. In this instance, the lightly doped n-type semiconductor layer 12 of the order of 11 microns thick.

As will be understood, the diode 20 has two p-n junctions a and c, and the electric characteristics of the two junctions a and c are independently designed. The Zener breakdown voltage is dominated by the major p-n junction a, and the other p-n junction c has the strong influence on the withstanding voltage against the electrostatic discharge and the amount of parasitic capacitance. Thus, the diode 20 has the Zener breakdown voltage adjusted to the target value without increase the parasitic capacitance.

Third Embodiment

Figure 6:
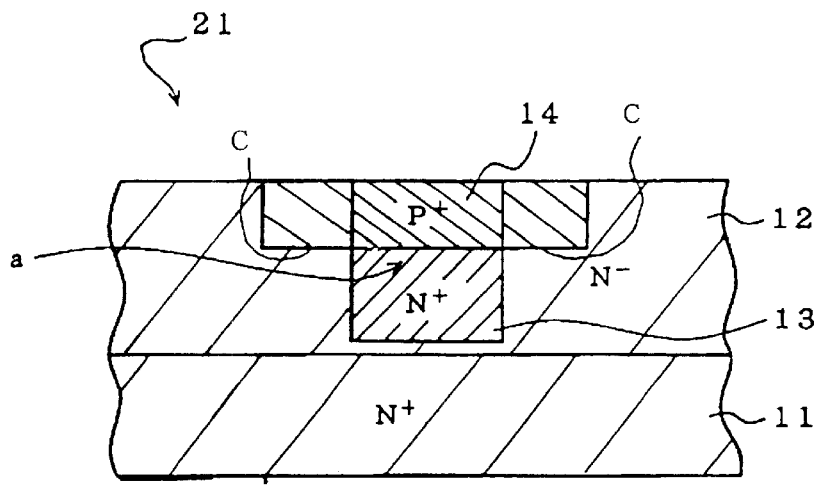
FIG. 6 is a cross sectional view showing the structure of yet another diode according to the present invention.
Figure 1:
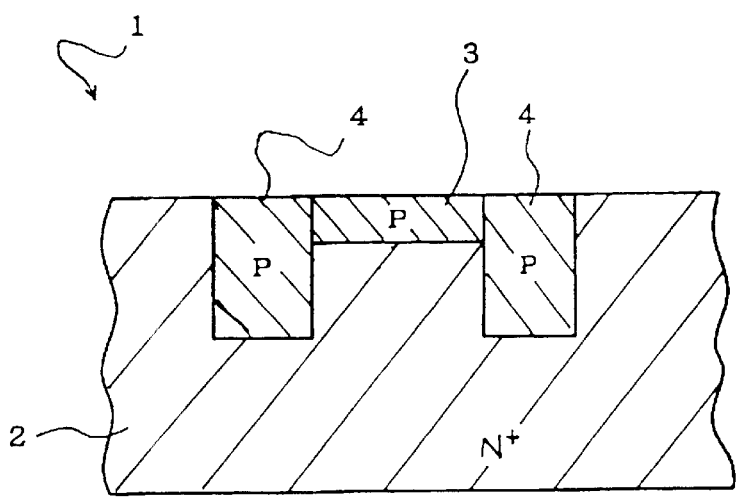
FIG. 1 is a cross sectional view showing the structure of the prior art protective diode.

FIG. 6 shows yet another diode 21 embodying the present invention. The diode 21 is similar to the diode 20 except that the heavily doped n-type impurity region 13 is spaced from the heavily doped n-type semiconductor layer 11. For this reason, the layers and regions of the diode 21 are labeled with the same references designating corresponding layers and regions of the diode 20 without detailed description for the sake of simplicity.

The gap between the heavily doped n-type impurity region 13 and the heavily doped n-type semiconductor layer 11 is dependent on the resistivity of the lightly doped n-type semiconductor layer 12. The gap is designed in such manner that the resistance after the breakdown is sharply increased. In other words, the design work for the part of the epitaxial layer between the heavily doped n-type impurity region 13 and the heavily doped n-type semiconductor substrate 11 aims at substantial reduction in resistance.

Even though the heavily doped n-type impurity region 13 is opposed to the heavily doped n-type semiconductor substrate 11 through the part of the lightly doped n-type semiconductor layer 12, the diode 21 achieves the high withstanding voltage against the electrostatic discharge and a small amount of parasitic capacitance. The drive-in step for the heavily doped n-type impurity region 13 is shorter than that of the second embodiment, and a turn around time is shortened.

When the diode 21 is reversely biased with the surge voltage, the Zener breakdown takes place, and a large amount of electric current flows vertically. The part of the lightly doped n-type semiconductor layer 12 serves as a resistor connected in series, and the diode suffers from the large resistance.

The two p-n junctions a and c are formed in the diode 21, and the lightly doped n-type semiconductor layer 12 eliminates the undesirable influences of the heavily doped n-type impurity region 13 from the diode 21. As a result, the parasitic capacitance is reduced to a quarter with respect to the prior art diode without increase of the semiconductor substrate 11. Moreover, the Zener breakdown voltage is adjustable without changing the dopant concentration of the semiconductor substrate 11.

If the lightly doped n-type semiconductor layer 12 is thin, if the heavily doped n-type impurity region 13 is deep, the resistance between the electrodes 18 and 19 is reduced.

As will be appreciated from the foregoing description, the p-type impurity region 14 forms the p-n junctions a/b or a/c together with the n-type impurity regions different in dopant concentration from each other in the diode according to the present invention. The breakdown voltage is dependent on the electric characteristics of the major p-n junction a, and the electric characteristics of the major p-n junction a are controlled with the dopant concentration in the p-type/n-type impurity regions on both sides of the major p-n junction. The other p-n junction does not have any influence on the breakdown voltage. On the other hand, the parasitic capacitance coupled to the diode is dominated by the other p-n junction b or c. For this reason, the breakdown voltage is adjustable without consideration of the parasitic capacitance.

Although particular embodiments of the present invention have been shown and described, it will be apparent to those skilled in the art that various changes and modifications may be made without departing from the spirit and scope of the present invention.

The diode according to the present invention is never limited to the protective usage. The advantage of the present invention is directed to the breakdown voltage not strongly tied up to the parasitic capacitance. For this reason, the diode according to the present invention is available for any kind of electric circuit where the designer thinks it important to adjust the breakdown voltage regardless of the parasitic capacitance. One of the applicable electric circuits is a clamp circuit.

If the n-type dopant impurity is ion implanted into the lightly doped n-type semiconductor layer at high acceleration energy, the projection range of the n-type dopant impurity is long. This means that the drive-in step is shortened.

A gas phase diffusion or an ion-implantation may be used in the process according to the present invention.

What is claimed is:

1. A diode fabricated on a semiconductor substrate (11), comprising a first semiconductor layer (14/15; 14) having a first conductivity type, and a second semiconductor layer (12/13) having a second conductivity type opposite to said first conductivity type and including an epitaxial region (12) grown on a surface of said semiconductor substrate and an impurity region (13) different in dopant concentration so that said epitaxial region and said impurity region are held in contact with said first semiconductor layer for forming a plurality of junctions, said plurality of junctions being different in electric characteristics from one another.

2. The diode as set forth in claim 1, in which a depletion layer developed from one of said plurality of junctions into said impurity region and a part of said first semiconductor layer is narrower than another depletion layer developed from another of said plurality of junctions into said epitaxialy region and another part of said first semiconductor layer under an application of a certain reversely bias voltage.

3. The diode as set forth in claim 2, in which said another of said plurality of junctions is wider in area than said one of said plurality of junctions.

4. The diode as set forth in claim 1, in which said impurity region is larger in dopant concentration than said epitaxial region so that depletion layers are different in thickness under application of a certain reverse bias voltage.

5. The diode as set forth in claim 4, in which the junction associated with said expitaxial region is wider in area than the junction associated with said impurity region.

6. The diode as set forth in claim 1, in which said first semiconductor layer has a plurality of regions forming said plurality of junctions together with said epitaxial region and said impurity region, respectively.

7. The diode as set forth in claim 6, in which one of said plurality of regions of said first semiconductor layer is different in dopant concentration from another of said plurality of regions of said first semiconductor layer.

8. The diode as set forth in claim 7, in which one (15) of said plurality of regions of said first semiconductor layer and said another (14) of said plurality of regions of said first semiconductor layer are formed in said epitaxial region of said second semiconductor layer in such a manner that said one of said plurality of regions of said first semiconductor layer is deeper than said another of said plurality of regions of said first semiconductor layer, and said impurity region (13) of said second semiconductor layers is formed in said epitaxial region (12) of said second semiconductor layer so that said one of said plurality of regions of said first semiconductor layer and said another of said plurality of regions of said first semiconductor layer form one of said plurality of junctions and another of said plurality of junctions together with said epitaxial region of said second semiconductor layer and said impurity region of said second semiconductor layer, respectively.

9. The diode as set forth in claim 8, in which said one of said plurality of regions of said first semiconductor layer and said another of said plurality of said first semiconductor layer are a lightly-doped guard ring and a first heavily-doped impurity region connected to said lightly-doped guard ring, and said epitaxialy region and said impurity region are a lightly-doped semiconductor layer epitaxially grown on a heavily-doped semiconductor layer of said second conductivity type and a second heavily-doped impurity region formed inside of said lightly-doped guard ring.

10. The diode as set forth in claim 1, in which said first semiconductor layer is designed to have a dopant concentration uniform thereover.

11. The diode as set forth in claim 10, in which said epitaxial region is epitaxially grown on a third semiconductor layer (11) of said second conductivity type which is heavier in dopant concentration than said epitaxial region and serving as said semiconductor substrate, and said impurity region is an impurity region which is heavier in dopant concentration than said epitaxial region and formed in a surface portion of said epitaxial region.

12. The diode as set forth in claim 11, in which said epitaxial region and said impuruity region form one of said plurality of junctions and another of said plurality of junctions together with said first semiconductor layer, and said one of said plurality of junctions is wider in area than said another of said plurality of junctions.

13. The diode as set forth in claim 11, in which said another of said plurality of junctions is connected to said third semiconductor layer.

14. The diode as set forth in claim 11, in which said another of said plurality of junctions is spaced from said third semiconductor layer.

* * * * *